United States Patent [19]

Wozniczka

[11] Patent Number: 4,691,765
[45] Date of Patent: Sep. 8, 1987

[54] HEAT SINK

[75] Inventor: George Wozniczka, Chicago, Ill.

[73] Assignee: Zenith Electronics Corporation, Glenview, Ill.

[21] Appl. No.: 846,664

[22] Filed: Mar. 31, 1986

[51] Int. Cl.$^4$ .............................................. F28F 7/00
[52] U.S. Cl. .................................. 165/80.3; 165/185; 361/386; 174/16 HS
[58] Field of Search ............... 165/185, 80.3; 361/386; 174/16 HS, 35 TS

[56] References Cited

U.S. PATENT DOCUMENTS

| | | | |
|---|---|---|---|
| 2,201,611 | 5/1940 | Del Camp | 174/35 TS |
| 2,395,326 | 2/1946 | Handley et al. | 174/35 TS |
| 4,054,901 | 10/1977 | Edwards et al. | 174/16 HS |
| 4,344,106 | 8/1982 | West et al. | 165/185 X |
| 4,388,967 | 6/1983 | Breese | 361/386 X |
| 4,609,040 | 9/1986 | Moore | 174/16 HS |

OTHER PUBLICATIONS

Catalog entitled AAVID, by Avid Engineering, Inc., p. 23, relating to heat sinks, May, 1983.

Primary Examiner—Albert W. Davis, Jr.
Assistant Examiner—Peggy A. Neils
Attorney, Agent, or Firm—Cornelius J. O'Connor; Thomas E. Hill

[57] ABSTRACT

A heat sink positioned on a printed circuit (PC) board includes a generally planar center portion and first and second pluralities of spaced planar ribs extending generally transversely from respective lateral edges of the center portion. The heat sink is adapted for generally perpendicular mounting on the PC board and includes first, second and third mounting tabs respectively extending from the lower edges of the bottom lateral ribs of the first and second pluralities of lateral ribs as well as from the lower edge of the planar center portion. Each mounting tab is adapted for insertion within a respective aperture in the PC board and includes an elongated proximal portion and a distal end portion. The distal end portion of the mounting tab is wider than the proximal portion thereof and includes a pair of cam surfaces, each disposed on a respective lateral edge of the mounting tab and adapted to engage a respective edge portion of the PC board immediately adjacent to the PC board aperture when the distal end portion is rotationally displaced about the elongated proximal portion of the mounting tab resulting in the twisting thereof. Thus, the heat sink is mounted on the PC board in a positive locking manner. Rotation of the mounting tab and further engagement of the cam surfaces thereof with the edges of the PC board aperture provide more intimate heat sink-PC board contact which affords increased thermal transfer, more secure and stable heat sink mounting, and more reliable PC board assembly.

9 Claims, 5 Drawing Figures

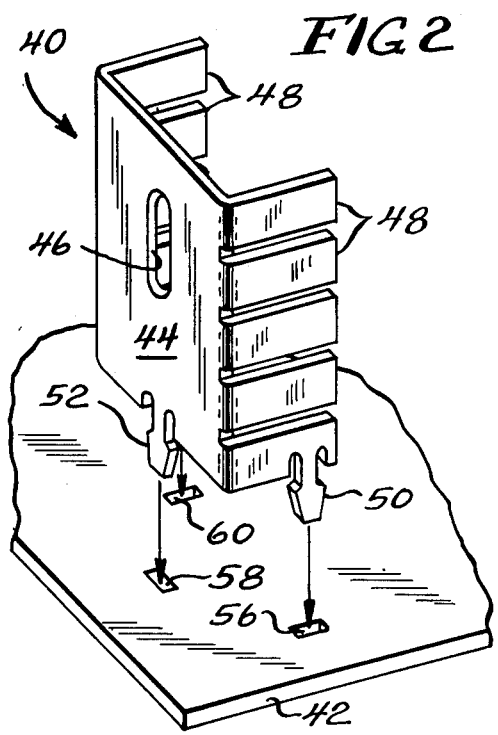
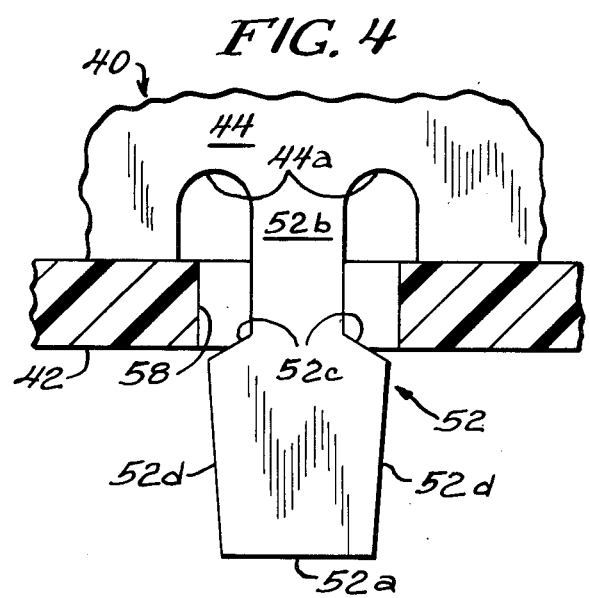
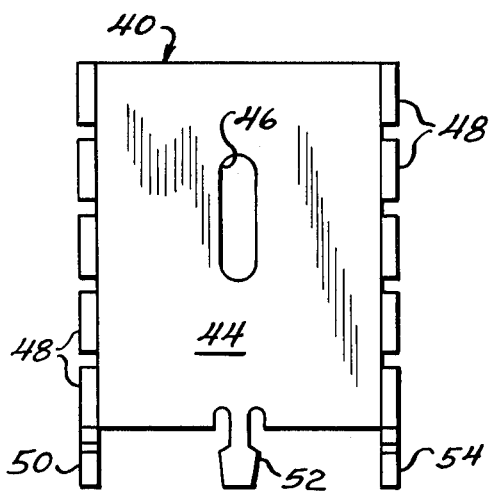
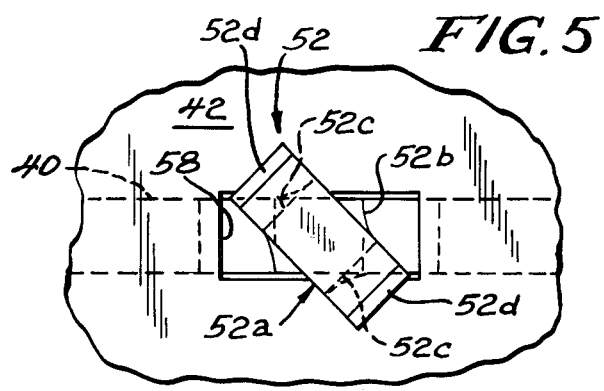
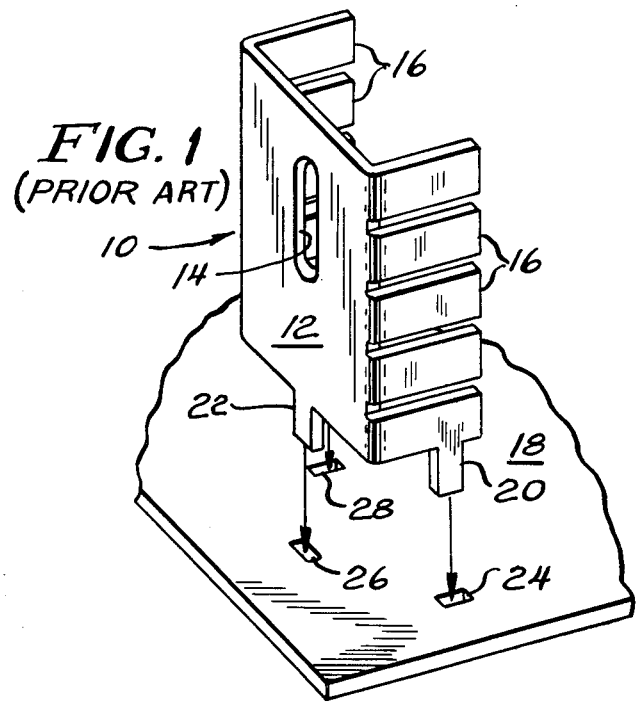

HEAT SINK

BACKGROUND OF THE INVENTION

This invention relates generally to heat removal and thermal dissipation in printed circuit (PC) boards and is more particularly directed to a mounting arrangement for securing a heat sink to a PC board in a positive locking manner.

Heat sinks are conventionally utilized with PC boards for limiting the operating temperature of electronic components positioned upon the board. The typical heat sink is comprised of a metal having a high thermal conductivity and is mounted to and in contact with the PC board to allow for the transfer of heat to the heat sink and its dissipation in the atmosphere. Heat sinks assume a wide range of configurations, all of which are intended to provide for secure mounting of the heat sink to the PC board, efficient heat transfer, and good thermal dissipation in the heat sink generally achieved by maximizing its surface area.

Referring to FIG. 1, there is shown a perspective view of a prior art heat sink 10. The prior art heat sink 10 is comprised of a heat conducting structure which includes a center portion 12 and a pair of lateral portions, each comprised of a plurality of spaced lateral ribs 16 integral with and extending from respective lateral edge portions of the aforementioned center portion. The heat sink 10 comprised of the center portion 12 and lateral ribs 16 is adapted for generally vertical positioning upon a PC board 18. The plurality of spaced lateral ribs 16 extending from the center portion 12 provide the heat sink 10 with a large surface area for more efficient heat removal from the PC board 18 and transmission to the surrounding environment by the heat sink. The center portion 12 of the heat sink 10 may be provided with an aperture 14 therein for directly mounting a circuit component (not shown) to the heat sink for limiting its operating temperature. The circuit board 18 is provided with a plurality of apertures 24, 26 and 28 which are adapted for receiving respective mounting tabs 20, 22 (a third aperture is not shown in FIG. 1) positioned on the lower edge portion of the heat sink 10. With a mounting tab inserted from above within each of the mounting apertures in the PC board, each of the mounting tabs is engaged from below the PC board and twisted about the longitudinal axis of the mounting tab so that the lateral edges of each mounting tab engage adjacent edges of the PC board which define the aperture within which the mounting tab is positioned. It is in this manner that the prior art heat sink 10 is positioned upon and secured to the PC board 18.

Because of the passive nature of the manner in which they function, the general simplicity of their design, and the availability of high heat conducting metals and alloys which can be readily shaped into heat sink structures, most limitations and problems encountered with heat sinks such as shown in FIG. 1 relate to the manner in which they are secured to the PC board. For example, a mounting arrangement which affords less than tight fitting, intimate contact between the heat sink and the PC board is limited in the amount of thermal energy which can be removed from the PC board and may result in malfunction or even destruction of circuit components positioned on the PC board substrate. The loose fitting positioning of the heat sink not only limits the amount of heat which can be dissipated, but also increases the likelihood of the heat sink becoming completely disengaged from the PC board and its removal therefrom, particularly where the PC board is subjected to vibration and shock. Removal of the heat sink from the PC board generally results in failure of the circuit mounted to the board because of the tight tolerances within which such circuits are designed. Finally, prior art heat sinks are generally secured to the PC board either by soldering the heat sink mounting tabs to the board or twisting the mounting tabs inserted within a PC board aperture so that the lateral edges of the mounting tabs engage and deform an adjacent edge of the PC board aperture. This mounting arrangement makes it difficult, if not impossible, to remove a heat sink once installed without either damaging the PC board or deforming the heat sink to the point where it is not re-usable.

The present invention represents an improved heat sink which does not suffer from the aforementioned limitations of the prior art in that it is easily inserted on a circuit board and maintained securely in position thereon by means of a positive locking force exerted by the mounting tabs thereof on the PC board. The extent of engagement between the heat sink and PC board may be fixed as desired during installation of the heat sink thereon in a mounting configuration which allows for easy removal of the heat sink from the PC board and its re-use.

OBJECTS OF THE INVENTION

Accordingly, it is an object of the present invention to provide an improved heat sink for use with a PC board.

It is another object of the present invention to provide increased heat transfer from a PC board to a heat sink mounted thereon.

Yet another object of the present invention is to provide more reliable and secure positioning for a heat sink on a PC board by means of a positive locking mounting arrangement.

A further object of the present invention is to provide an improved mounting arrangement for a heat sink on a PC board which affords more intimate heat sink-PC board contact while allowing for easy removal of the heat sink and its re-use.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a perspective view of a prior art heat sink mounting arrangement;

FIG. 2 is a perspective view of a heat sink mounting arrangement in accordance with the principles of the present invention;

FIG. 3 is a lateral view of a heat sink in accordance with the present invention;

FIG. 4 shows the details of the mounting tabs positioned on an edge of the heat sink of FIGS. 2 and 3 in accordance with the present invention; and FIG. 5 is a plan view illustrating the manner in which a heat sink mounting tab is inserted within a PC board aperture and twisted for securely engaging portions of the PC board adjacent to the aforementioned aperture and securely mounting the heat sink to the PC board.

DETAILED DESCRIPTION OF THE PREFERRED EMBODIMENT

Referring to FIG. 2, there is shown a perspective view of an improved heat sink 40 in accordance with the present invention. A front lateral view of the improved heat sink 40 is shown in FIG. 3.

The improved heat sink 40 is adapted for generally vertical positioning upon a PC board 42 and is preferably comprised of a metallic material having a high heat conduction characteristic. The improved heat sink 40 is comprised of an integral, unitary structure which includes a generally planar center portion 40 and first and second pluralities of lateral ribs 48 extending from respective lateral edges of the center portion and oriented generally transversely with respect thereto. Each plurality of lateral ribs 48 form a generally parallel array of spaced, flat linear members extending from the center portion 44 of the heat sink 40. The center portion 44 may be provided with a slot-like aperture 46 therein for directly mounting a circuit component (not shown) directly to the heat sink 40 by conventional means such as a mounting screw (also not shown) for limiting the operating temperature of the circuit component.

The PC board 42 is provided with a plurality of elongated spaced apertures 56, 58 and 60 therein which are adapted to receive a respective mounting tab 50, 52 and 54 positioned on the lower edge portion of the heat sink 40. In a preferred embodiment, the PC board apertures are generally rectangular in shape. As shown in FIGS. 2 and 3, mounting tabs 50 and 54 are integral with and extend from a respective lower lateral rib 48 extending from the center portion 44 of the heat sink 40. Therefore, in the embodiment of the improved heat sink of the present invention, the heat sink 40 is shown as a three-sided structure having three mounting tabs 50, 52 and 54 positioned upon and extending from adjacent edges of the three sides forming the heat sink structure. The improved heat sink 40 of the present invention is, of course, not limited to this specific configuration, but may include virtually any number of attached sides, or members, as well as virtually any number of mounting tabs extending from the lower edge of the heat sink structure.

Referring in particular to FIG. 4, which shows the details of the second mounting tab 52 positioned upon the improved heat sink 40, as well as to the aforementioned FIGS. 2 and 3, the manner in which the heat sink of the present invention is securely attached to a PC board will now be described in detail. While the following discussion is specifically directed to the details of the second mounting tab 52 and the manner in which it engages the PC board 42, this discussion is equally applicable to the remaining two mounting tabs 50, 54 positioned on an edge of the improved heat sink 40 for securely attaching the heat sink to the PC board in accordance with the principles of the present invention.

The second mounting tab 52 includes a distal end portion 52a and an elongated proximal portion 52b. The elongated proximal portion 52b extends from an edge of the center portion 44 of the heat sink 40 and has positioned on respective sides thereof slots 44a in an edge of the center portion of the heat sink. The distal end portion 52a extends from and is integral with the elongated proximal portion 52b of the mounting tab 52. The distal end portion 52a is wider than the elongated proximal portion 52b of the heat sink 40 and is adapted for insertion through the aperture 58 within the PC board 42. The end of the distal end portion 52a positioned adjacent to the elongated proximal portion 50b of the mounting tab 52 is provided with a pair of cam edges 52c thereon. Similarly, lateral, facing portions of the distal end portion 52a of the mounting tab 52 are provided with tapered edges 52d for facilitating its insertion within the PC board aperture 58.

With the mounting tab 52 positioned within and extending through the aperture 58 within the PC board 42, the manner in which the improved heat sink 40 is securely attached to the PC board will now be described with respect to FIGS. 4 and 5. With the mounting tab 52 positioned within the PC board aperture 58, the cam edges 52c of the mounting tab are aligned generally with the lower edge portions of the PC board 42 which define the aperture therein. With the cam edges 52c of the mounting tab 52 thus aligned with the lower edge portions of the PC board 42, the distal end portion 52a of the mounting tab is grasped and rotated abour the longitudinal axis of the elongated proximal portion 52b of the mounting tab. Conventional means, which are not shown, as utilized in the high speed fabrication and assembly of PC boards may be used to engage and rotionally displace the distal end portion of the mounting tab.

With each of the PC board apertures 56, 58 and 60 having a generally rectangular shape, as specifically shown in FIG. 5, rotation of the distal end portion 52a of the mounting tab 52 displaces the cam edges 52c of the mounting tab 52 in abutting engagement with respective, facing lower edges of the PC board defining the aperture 58 therein. Further rotation of the distal end portion 52a of the mounting tab 52 will result in downward displacement of the mounting tab as well as the heat sink 40 coupled thereto. It is in this manner that the heat sink 40 may be securely mounted to the PC board 42, with intimate contact established between the heat sink and the surface of the PC board along the length of the adjacent edge of the heat sink. By establishing the rotational displacement of the distal end portion 52a of the mounting tab 52 as well as the angled orientation of the cam edges 52c thereon, the extent of engagement and the intimacy of contact between the heat sink and PC board may be set as desired. For example, additional rotation of the distal end portion 52a of the mounting tab 52 as well as increasing the slope of the cam edges 52c will increase the engaging force between the heat sink and the PC board resulting in more secure positioning of the heat sink thereon. More secure positioning of the heat sink upon the PC board may be desirable where the combination will be subjected to a hostile environment such as one in which there is excessive vibration or where it is desired to provide maximum contact between the heat sink and PC board for increased thermal transfer and heat dissipation.

As previously described, the edge portion of the center portion 12 is provided with a pair of spaced slots, shown in FIG. 4 as elements 44a in the center portion 44 of the heat sink 40. Similar paired slots are provided immediately adjacent to mounting tabs 50, 54 extending from respective lower lateral ribs 48. The slots 44a provide for an increased effective length of the elongated proximal portion 52b of the mounting tab 52 which reduces the possibility of breaking the elongated proximal portion when it is twisted during the mounting of the heat sink on the PC board. Increasing the effective length of the elongated proximal portion 52b of the mounting tab 52 reduces the turns per unit length imposed thereon and increases the reliability of mounting a heat sink in accordance with the present invention.

There has thus been shown an improved heat sink which provides more secure and reliable mounting of the heat sink on a PC board, as well as efficient thermal transfer from the PC board and heat dissipation by the heat sink.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A heat sink positioned on a PC board for removing and dissipating heat in the PC board, said PC board having a plurality of spaced elongated apertures therein, said heat sink comprising:
   a heat conducting body comprised of a plurality of generally planar members coupled along respective adjacent lateral edges thereof so as to form a unitary, multi-section structure having a generally continuous, flat edge portion thereon; and
   a plurality of mounting tabs each attached to a respective planar member of said multi-section heat conducting body along the flat edge portion thereof and adapted for insertion within a respective PC board aperture, each of said mounting tabs having an elongated proximal portion and a distal end portion wider than the proximal portion of said mounting tab, wherein said distal end portion includes beveled cam means adapted for engaging an edge of the PC board aperture within which said mounting tab is inserted when said distal end portion is rotationally displaced about said elongated proximal portion resulting in the twisting thereof and for displacing said heat conducting body toward the PC board whereupon the PC board is positioned in intimate contact with the flat edge portion of said heat conducting body along the length thereof.

2. The heat sink of claim 1 wherein said heat conducting body is positioned on a first surface of the PC board and said cam means engages an edge of the PC board adjacent to the aperture therein on a second, facing surface of the PC board.

3. The heat sink of claim 2 wherein said cam means comprises a plurality of beveled edges on the distal end portion of said mounting tab for engaging a respective PC board edge adjacent to the aperture therein.

4. The heat sink of claim 3 wherein each aperture in the PC board is generally rectangular and includes a pair of facing PC board edges and wherein each beveled edge of the distal end portion of said mounting tab engages a respective facing PC board edge when said distal end portion is rotationally displaced.

5. The heat sink of claim 1 wherein each planar member of said heat conducting body includes means defining first and second slots located adjacent to the elongated proximal portion of said mounting tab and extending inward from the flat edge portion of said heat conducting body.

6. The heat sink of claim 1 wherein the distal end portion of each of said mounting tabs further includes a tapered edge portion to facilitate insertion of said mounting tab into a respective PC board aperture.

7. The heat sink of claim 6 wherein the tapered edge portion of the distal end portion of said mounting tab is aligned with the cam means thereon.

8. The heat sink of claim 1 wherein said heat conducting body includes three generally planar members each having a respective mounting tab on an adjacent edge thereof and wherein the adjacent edges of said three planar members form the generally continuous, flat edge of said heat conducting body.

9. The heat sink of claim 8 wherein said three generally planar members include a center section and two lateral sections coupled to respective lateral edges of said center section and wherein each of said lateral sections includes a plurality of spaced ribs arranged in a generally planar array.

* * * * *